United States Patent [19]

Cather et al.

[11] Patent Number: 4,792,880

[45] Date of Patent: Dec. 20, 1988

[54] TERMINAL MODULE

[75] Inventors: Robert L. Cather, Wilkins Township, Allegheny County; James F. Sutherland, Plum Borough, both of Pa.

[73] Assignee: Westinghouse Electric Corp., Pittsburgh, Pa.

[21] Appl. No.: 120,738

[22] Filed: Nov. 12, 1987

Related U.S. Application Data

[63] Continuation of Ser. No. 914,855, Oct. 3, 1986, abandoned.

[51] Int. Cl.[4] ............................................. H05K 5/02

[52] U.S. Cl. .................................. 361/426; 174/52.2; 361/399; 439/65; 439/559

[58] Field of Search ....................... 439/59, 62, 65, 76, 439/78, 559, 620; 174/52 PE, 52 FP; 361/395, 399, 415, 400, 403, 409, 410, 413, 426, 429, 405

[56] References Cited

U.S. PATENT DOCUMENTS

Re. 29,683 6/1978 Ocken, Jr. .
4,574,33 3/1986 Smolley .
2,349,629 5/1944 Lazich et al. .
3,430,182 2/1969 Blanche .
3,443,160 5/1969 Salera .
3,522,485 8/1970 Metrick .
3,622,949 11/1971 Sorenson .
3,728,656 4/1973 Neuber .
4,089,041 5/1978 Lockard .
4,164,725 8/1979 Wiebe .
4,206,436 6/1980 Grunert et al. .
4,330,637 5/1982 Wong .
4,420,652 12/1988 Ikeno .
4,510,677 4/1985 Collumeau .
4,542,443 9/1985 Rinefiend ............................ 361/399
4,591,950 5/1986 Houpt ................................ 361/399
5,542,260 9/1985 Pearce .

*Primary Examiner*—G. P. Tolin
*Attorney, Agent, or Firm*—D. C. Abeles

[57] ABSTRACT

A terminal module provides for attaching components to terminals of a terminal frame. The terminal module utilizes an integral printed circuit board having a component assembly potted within a rectangular plastic shell with the remaining portion of the printed circuit board protruding from the shell for use as electrical terminals and for physical attachment to screw terminal strips of the termination frame. The modules are suitably of a predetermined geometric configuration, and the potted component assembly portion is contoured to fit between respective ones of stacked terminal strips.

10 Claims, 4 Drawing Sheets

TERMINAL MODULE

This is a continuation, of application Ser. No. 914,855, filed Oct. 3, 1986. (not aband)

BACKGROUND OF THE INVENTION

1. Field of the Invention

This invention is directed to terminal modules for housing small circuits which are electrically connected across field wiring terminals and, more particularly, to moudlarized packages which are adapted for concurrent physical and electrical connection to two or more terminals on a frame containing a plurality of field wiring terminals. A primary application of the invention is in electrical data acquisition systems using microprocessors and other monitoring circuitry mounted on printed circuit boards to manage data input and output, such as for providing control and protection functions for systems in electrical power plants and generators.

2. Prior Art

Present day industrial electrical data acquisition and processing systems frequently require stacked termination frame assemblies or terminal connectors mounted typically in a cabinet with the field terminals accessible through a first door and with the circuit boards and component assemblies which are connected to other equipment in the cabinet being accessible through an opposite door. In such applications it is frequently required to have one or more electronic components mounted across the field wiring leads, i.e., not part of the circuit board assemblies and separately accessible. While such components could be made a part of the I/O electrical circuitry itself, frequently this is not possible or convenient. Thus, often it is desirable that the circuit boards to which the field terminals connect may be removed for maintenance without affecting the overall field system operation, which can be done if the components in question are separately connected to the field terminals. For example, one or more dropping resistors may be utilized in a field current loop, the dropping resistors being connected across the field terminals while the processing and analyzing circuitry receives its input from the dropping resistors.

A common prior practice in applications as referred to above is to physically terminate the wire leads of the electronic components directly to the screw terminals used for the field wiring. This arrangement not only gives the appearance of a last minute design change, but exposes the electronic component or components to physical damage during assembly, maintenance or other events. The performance and maintenance of the external components is sensitive to unforeseen installation mistakes, such as shorting of the component to the chassis where the proper assembly technique is not followed. Further, it is readily seen that where plural components are to be connected across two or more field terminals, the method of direct attachment of the components to the terminals becomes even less desirable.

A typical prior art approach has been to contain an external component in a potted box or other potting means, with metal connector blades or pins extending out of the potting material. Basically this constitutes simply an encapsulation of the component in order to protect it, and does not provide the desired ability to achieve reliable electrical and mechanical attachment.

There is thus a need in this art area for a standardized package and means of reliably connecting, both mechanically and electrically, external components to field screw terminals. This need has required an engineered packaging approach that permits housing of a plurality of small electronic components in a small, modular, lightweight and rugged assembly, and which provides reliable and quick attachment of the component module to the terminal assembly.

SUMMARY OF THE INVENTION

In accordance with the present invention, there is provided a terminal module which is a compact assembly of predetermined geometry which is attached to two or more terminals of a terminal block connector. The module comprises a printed circuit board having a first portion which carries one or more circuit components and which is potted within a rectangular plastic shell. The remainder of the integral printed circuit board protrudes from the shell and has blade portions configured for use both as electrical terminals and for physical attachment to the screw terminals of the terminal connector. The module thus provides the advantages of a standardized package which is adapted to carry a plurality of components and for making reliable mechanical and electrical connection to the field terminals.

It is a further object and advantage of the subject invention that a printed circuit board assembly is used for reliable and efficient mounting of components, the module further providing efficient means for attaching the entire assembly to the field terminals. In a preferred form of the invention a flame-retardant potting shell is utilized along with an encapsulating material which reduces risk of flammability. A resilient high-temperature pre-coating is placed over the electronic components prior to the encapsulation to prevent breakage by stresses set up when the encapsulant is curing.

Further disadvantages of the terminal module of the invention are provided to enhance the reliability of proper installation and to insure long term reliable use. The printed circuit is provided with plate-through holes and a double sided circuit pattern for connecting the components, thereby providing redundant paths on each side of the board and better connection at the terminal. The invention further employs necked-down etched circuitry to increase the creep distance between the board circuit conductors at the point of entry into the encapsulant. The shell housing the component assembly is preferably a rectangular shell which carries indentifying markings and date codes. A polarity mark is etched into the board circuitry to verify correct assembly and installation of polarity sensitive circuitry on the screw terminals.

While the preferred embodiment is described as providing for connection of the module to two adjacent terminals on a terminal block, the modular design of this invention provides for and embraces ready extension to applications requiring connection to more than two terminals and/or non-adjacent terminals. Whatever the required field terminal arrangement, the use of the integral printed circuit board enables any desired combination of components to be reliably connected to a terminal block.

DESCRIPTION OF THE PREFERRED EMBODIMENTS

Figure 1:
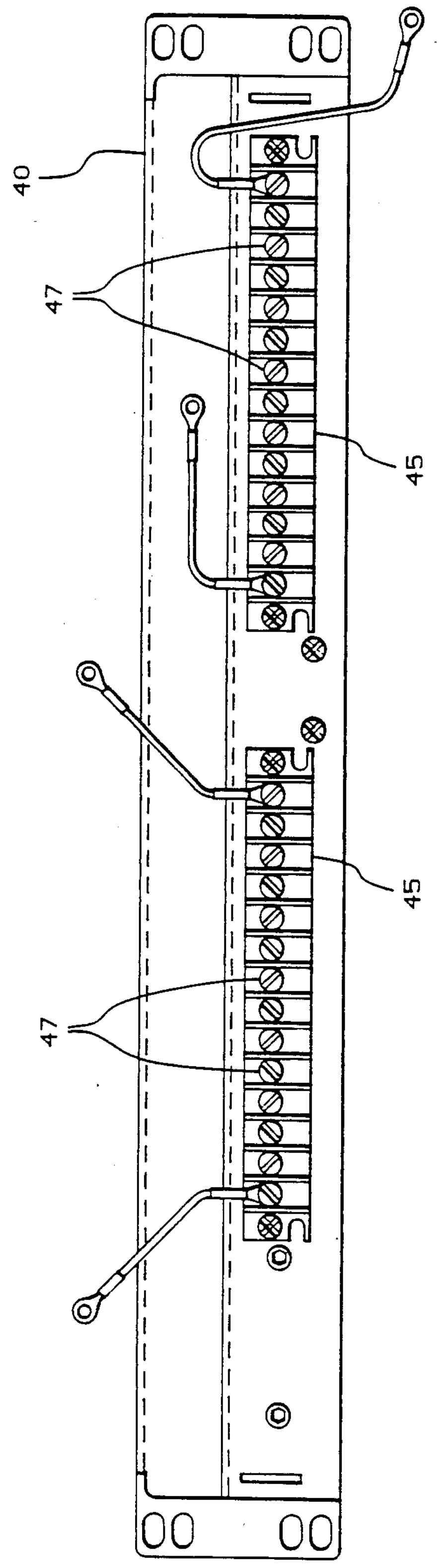
FIG. 1 is a front elevation view of a prior art termination frame of the form which may be utilized with the terminal module of this invention.

The terminal module disclosed in this specification is used in conjunction with a terminal block connector which provides connections through to one or more printed circuit boards, such as is disclosed in U.S. Pat. No. 4,542,443, Rinefierd, Jr., assigned to the same assignee. The Rinefierd patent discloses what is referred to therein as a termination frame assembly, and more particularly a stack of termination frame assemblies mounted in a cabinet. FIG. 1 represents substantially the same drawing as presented in FIG. 3 of U.S. Pat. No. 4,542,443, and shows a termination frame assembly, referred to herein as a termination frame 40 having thereon two terminal strips 45, each strip 45 having a plurality of screw-type terminals 47 aligned in a horizontal array. As seen more particularly in FIG. 2B, a terminal moduel unit 50 is attached to a pair of adjacent terminals 47 of the strip 45. Although just one such terminal module 50 is illustrated as being so connected, it is to be understood that any appropriate number of such modules may be connected to terminals 47. Furthermore, it is within the scope of the invention that the modules be connected to two or more terminals 47, which terminals may be adjacent or non-adjacent depending upon the application involved. Reference is made to the aforementioned U.S. Pat. No. 4,542,443 which is incorporated herein by reference, for a discussion of the manner and means by which a printed circuit boards, including microprocessors, are mounted to the other side of termination frame 40 and in electrical connection with terminals 47 for managing data input and output, and the manner by which wiring from field locations is connected through to the termination frame 40.

Figure 2B:
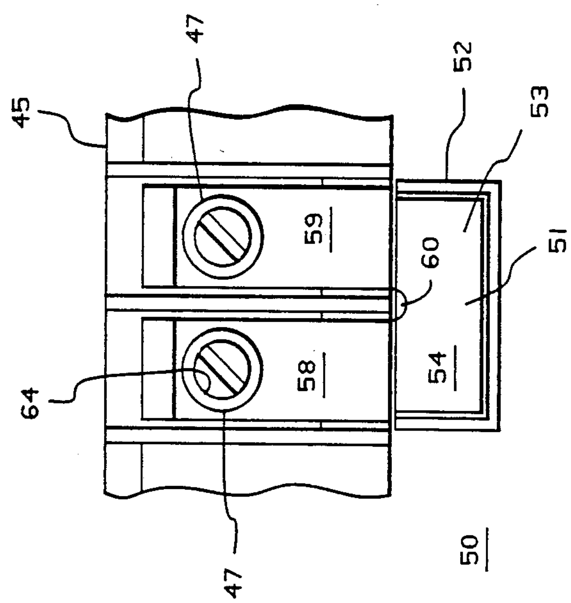
FIG. 2B is a front elevation view of the terminal module connected to two adjacent screw terinals of a termination frame.
Figure 2A:
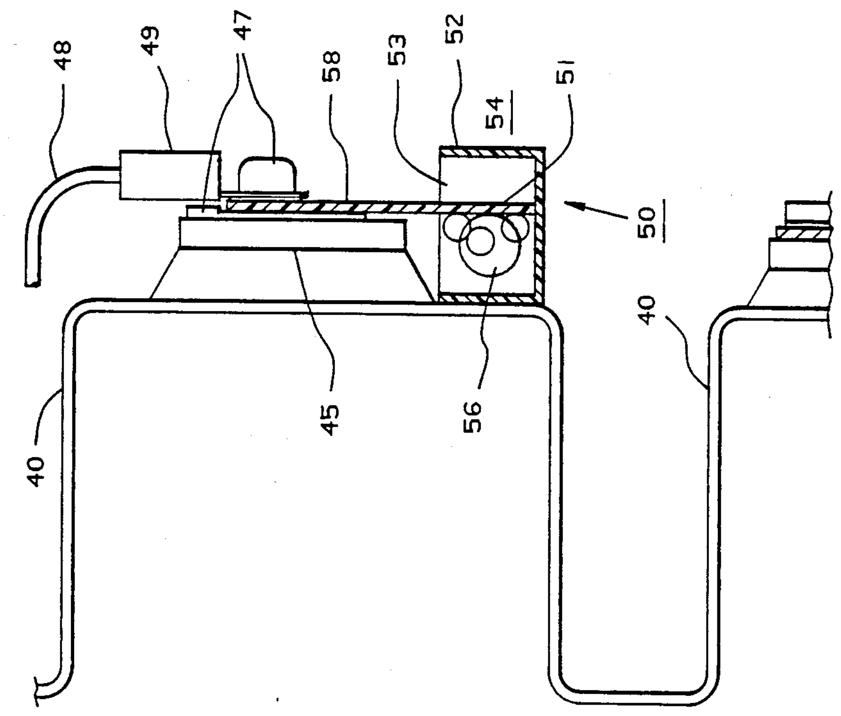
FIG. 2A is a side elevation view of the terminal module of this invention connected to a terminal strip of a termination frame, and illustrating the positioning of the potted portion of the module between adjacent stacked terminal strips.

Referring particularly to FIGS. 2A and 2B, there is illustrated a module 50 mounted in mechanical and electrical connection with a pair of adjacent terminals 47. A field wire 48 and wiring lug 49 are shown connected to a terminal 47. The module comprises a one-piece integral circuit board 51 which, as illustrated, has two upper portions or blades 58, 59 which are physically separated by a slot 60. The blades have holes 64 (see also FIG. 3A) in the upper portions thereof of a size and spacing to enable mounting of the module onto terminals 47 and mechanical connection thereto. The lower portion of the printed circuit board, as seen in FIG. 2A, carries one or more electrical components electrically wired thereto and shown symbolically at 56. The lower portion carrying the component assembly is housed within a substantially rectangular plastic shell 52, the component assembly being contained within encapsulant 53. Although components are illustrated as being on only one side of the board 51, they may be contained on either or both sides. The potted assembly comprising elements 52, 53, 56 and the lower portion of the board 51 is referred to as the potted component means 54.

In the preferred embodiment, the shell 52 is a flame retardant material such as diallyl phthalate, while the encapsulating material may be a two part epoxy comprising an epoxy casting resin and a catalyst. The resin is mixed in a container until uniform in texture, at which time 8-9% by weight of the catalyst is blended thoroughly therein. The mixture is then poured into the potting shell 52 to the indicated level. Also, in the preferred embodiment, a resilient high temperature precoating of an RTV silicone is utilized for pre-coating the electronic components, so as to prevent breakage, e.g., of glass diode packages by stresses set up by the encapsulant when curing.

As seen further in FIG. 2A, a plurality of terminal strips 45 may be stacked one on top of another leaving a gap therebetween. The terminal module is designed so that the shell 52 fits just below the forwardly extending portion of the terminal strip and between vertically aligned adjacent terminal strips.

Figure 3A:
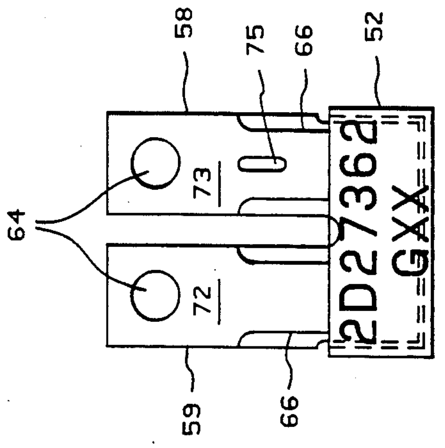
FIGS. 3A, B and C are diagrammatic front, side and back views of a terminal module of this invention.
Figure 3B:
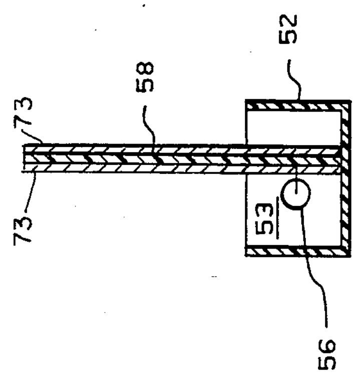
Figure 3C:
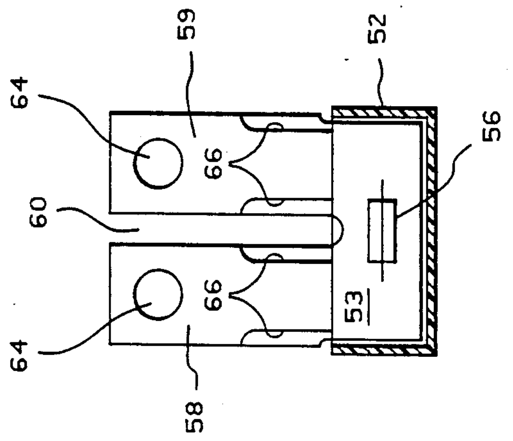

Referring to FIGS. 3A-3C, the terminal module unit 50 is illustrated diagrammatically in front, side and rear views. Each of the blades 58, 59 of the block has a conductive surface which is preferably a copper coating covered with tin plating. This surface is neck-down etched as shown at 66 to increase the creep distance between the circuit conductors at the point of their entry into the encapsulant 53. By this means the rugged structural support of the glass-epoxy printed circuit board substrate and the terminal conductors are maintained, without any sacrifice of the electrical characeristics. The use of the printed circuit terminal conductor surfaces, or tabs, avoids fractures usually associated with work-hardening of tabs comprised of all copper whichg may occur under continuous vibration conditions at the stress concentration point.

As illustrated in FIG. 3C, the rectangular shell is adapted for carrying identifying markings and/or date codes, which provides an important advantage for field installations of this nature. Further, as indicated at 75, a polarity mark is etched into the circuitry on one of the blades to verify the correct assembly and installation of polarity sensitive circuitry on the screw terminals. Further, different colored potting shells are used for each unique function or component assembly, to make assembly inspection and maintenance for the system easier, simpler and more reliable.

Figure 4A:
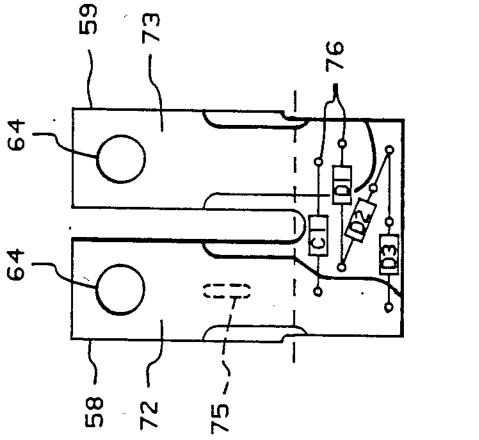
FIGS. 4A and B are diagrammatic representations of the component side and back side respectively of the printed circuit board, showing the redundant conductor path arrangement.
Figure 4B:
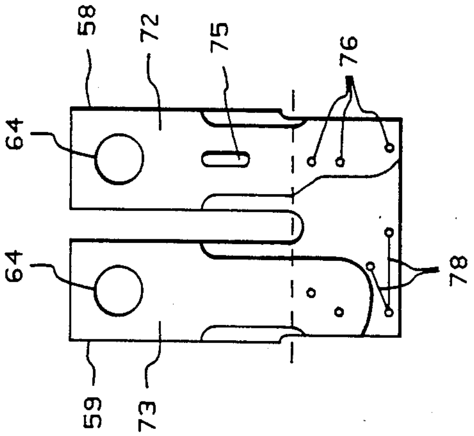

Referring to FIGS. 4A and 4B, there are shown diagrammatic views of opposite sides of a printed circuit board carrying a component assembly comprising a capacitor C1 in parallel with a series combination of diodes D1, D2 and D3. As illustrated, each of the main terminal tabs, or conductive pathways 72, 73 is printed on each side of the respective blades 58, 59. In other words, the circuit conductive material on the printed circuit board is double-side-printed with plated-through holes 76 connecting the opposite sides. In this matter redundant paths are provided on each side of each blade, thereby providing improved reliability over the technique of depending merely on one soldered connection for each component lead. The double sided printed blade also insures excellent connection at the point of the electrical contact with the screw terminal 47.

There has thus been disclosed an improved terminal module for carrying one or more circuit components for connection to field terminals, in combination with one or more terminal block connectors. The single integral printed circuit board which performs the dual functions of carrying a circuit component assembly in predetermined wired form as well as providing reliable means for electrical and mechanical connection to the field terminals, provides distinct advantages over the prior art. The module provides simple but reliable packaging of components in standardized packages, thereby simplifying installation in the field.

We claim as our invention:

1. A termination frame having a terminal strip mounted thereon with the terminal strip having a plurality of spaced terminals projecting therefrom, and a terminal module mounted on at least one of said terminals, said terminal module comprising:

a printed circuit board, said board having a plurality of extending blades, at least one electrical component mounted on said printed circuit board, potted component means enclosing a portion of said printed circuit board including said electrical component mounted on said printed circuit board, said blades freely protruding from said potted component means, said potting means being a ptting shell enclosing said components and an encapsulating material within said shell and encapsulating said components, electrical conductor means on at least one surface of said printed circuit board and said blades for defining a plurality of circuit points to which said electrical component is connected and for making electrical connections between respective ones of said circuit points and the conductor means on respective ones of said blades; and said blades being mounted on respective terminals of the terminal strip so that the terminal module is supported on said terminal strip by said blades and the electrical conductor means on said blades are electrically connected to said terminals of the terminal strip wherein the blades of the circuit board extend across the face of the terminal strip and the potted portion of the printed circuit board is along and adjacent to one edge of the terminal strip.

2. The termination frame as described in claim 1, further comprising said circuit board having double sided printed circuit material thereon with plated-through holes therethrough, thereby providing redundant conductor paths on each side of each said blade.

3. The termination frame as described in claim 1 wherein a plurality of electrical components are electrically connected to said board and enclosed in said potted component means.

4. The termination frame as described in claim 1, wherein said potting shell is composed of a flame-retardant material and filled with flame-retardant encapsulant.

5. The termination frame as described in claim 1 wherein a polarity mark is etched into one of said blades to verify a correct assembly and installation.

6. The termination frame as described in claim 1, wherein each of said blades has a predetermined similar geometry, and said blades are spaced one from another corresponding to the terminal spacing of said terminal assembly.

7. The termination frame as described in claim 1, wherein said potted component means comprises a housing which encloses the lower portion of said board on both sides thereof, and wherein said blades extend from said housing.

8. The termination frame as described in claim 7, wherein said blades comprise etched conductive circuitry on each side thereof, said circuitry being necked-down at the point of entry into said potted component means, thereby to increase the creep distance between said blade conductor surfaces.

9. The termination frame as described in claim 1, wherein said terminals are screw-type terminals, and each of said blades has an openign adapted for mechanical attachment to it respective terminal.

10. A termination frame as described in claim 1 including a plurality of spaced, substantially parallel terminal strips on said terminal frame, and wherein the potted portion of the printed circuit board of the module is within a space between an adjacent pair of said terminal strips.

* * * * *